US012809714B2

(12) United States Patent
Park

(10) Patent No.: US 12,809,714 B2
(45) Date of Patent: Nov. 24, 2026

(54) MEMORY DEVICE, MEMORY SYSTEM INCLUDING THE SAME, AND OPERATING METHOD THEREOF

(71) Applicant: SAMSUNG ELECTRONICS CO., LTD., Suwon-si (KR)

(72) Inventor: Jongwook Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 93 days.

(21) Appl. No.: 18/529,065

(22) Filed: Dec. 5, 2023

(65) Prior Publication Data

US 2024/0419531 A1 Dec. 19, 2024

(30) Foreign Application Priority Data

Jun. 14, 2023 (KR) ........................ 10-2023-0076123

(51) Int. Cl.

| | |
|---|---|
| ***G06F 11/07*** | (2006.01) |
| ***G06F 11/16*** | (2006.01) |
| ***G06F 11/20*** | (2006.01) |
| ***G06F 12/10*** | (2016.01) |
| ***G11C 29/00*** | (2006.01) |
| *G11C 29/44* | (2006.01) |

(52) U.S. Cl.

CPC .......... *G06F 11/0793* (2013.01); *G06F 11/16* (2013.01); *G06F 11/20* (2013.01); *G06F 11/2023* (2013.01); *G06F 12/10* (2013.01); *G11C 29/70* (2013.01); *G11C 2029/4402* (2013.01)

(58) Field of Classification Search

CPC ...... G06F 11/0793; G06F 12/10; G06F 11/16; G06F 11/20; G11C 29/70

See application file for complete search history.

(56) References Cited

U.S. PATENT DOCUMENTS

| | | | | |
|---|---|---|---|---|
| 5,831,913 A | 11/1998 | Kirihata | | |
| 6,108,251 A | 8/2000 | Manning | | |
| 6,646,932 B2 | 11/2003 | Kato et al. | | |
| 6,813,198 B2 | 11/2004 | Kyung | | |
| 6,879,530 B2 * | 4/2005 | Callaway | G11C 29/44 | 365/201 |
| 7,320,100 B2 * | 1/2008 | Dixon | G11C 29/4401 | 714/733 |

(Continued)

FOREIGN PATENT DOCUMENTS

| | | |
|---|---|---|
| KR | 10-0171951 | 10/1998 |
| KR | 10-2023-0036853 A | 3/2023 |

OTHER PUBLICATIONS

Office Action dated Oct. 14, 2026 issued in corresponding to Korean Patent Application No. 10-2023-0076123.

*Primary Examiner* — Jonathan D Gibson

(74) *Attorney, Agent, or Firm* — Morgan, Lewis & Bockius LLP

(57) ABSTRACT

A memory device includes at least one swap circuit swapping a plurality of decoded row addresses with one repair address using repair data, at least one register storing the repair data, a wordline activation signal driver receiving the repair address and outputting a wordline activation signal, and a sub-wordline driver activating corresponding sub-wordlines in response to the wordline activation signal.

20 Claims, 9 Drawing Sheets

(56) References Cited

U.S. PATENT DOCUMENTS

| | | | | |
|---|---|---|---|---|
| 7,565,593 | B2 * | 7/2009 | Dixon | G11C 29/848<br>714/754 |
| 9,583,161 | B1 | 2/2017 | Kim et al. | |
| 10,692,582 | B2 | 6/2020 | Kim | |
| 10,734,062 | B2 | 8/2020 | Koo et al. | |
| 10,896,133 | B2 * | 1/2021 | Shaw | G06F 13/1673 |
| 2005/0022065 | A1 * | 1/2005 | Dixon | G06F 11/106<br>714/42 |
| 2009/0063896 | A1 | 3/2009 | Lastras-Montano et al. | |
| 2016/0077940 | A1 * | 3/2016 | Son | G06F 11/1048<br>714/6.22 |
| 2017/0091026 | A1 * | 3/2017 | Gulati | G11C 29/52 |
| 2019/0019569 | A1 * | 1/2019 | Pope | G11C 29/44 |
| 2021/0295944 | A1 * | 9/2021 | Lim | G11C 29/76 |
| 2021/0319845 | A1 * | 10/2021 | Meehan | G11C 29/808 |
| 2021/0407619 | A1 * | 12/2021 | Ong | G11C 29/04 |
| 2022/0343994 | A1 * | 10/2022 | Chang | G11C 29/4401 |
| 2022/0399341 | A1 | 12/2022 | Kim | |
| 2024/0419531 | A1 * | 12/2024 | Park | G11C 29/76 |

* cited by examiner

MEMORY DEVICE, MEMORY SYSTEM INCLUDING THE SAME, AND OPERATING METHOD THEREOF

CROSS-REFERENCE TO RELATED APPLICATION(S)

This application claims priority under 35 U.S.C. 119 to Korean Patent Application No. 10-2023-0076123 filed on Jun. 14, 2023 in the Korean Intellectual Property Office, and all the benefits accruing therefrom, the disclosure of which is incorporated herein by reference in its entirety.

BACKGROUND

The present inventive concept relates to a memory device, a memory system including the same, and an operating method thereof.

In general, as miniaturization of a dynamic random access memory (DRAM) manufacturing process progresses, the incidence of memory cells having hard or soft defects, i.e., defective cells, increases. Here, the hard defective cell represents a memory cell having a permanent defect, and the soft defective cell represents a memory cell temporarily defective due to a slight defect.

SUMMARY

An aspect of the present inventive concept is to provide a memory device performing an address swap function during a repair operation, a memory system including the same, and an operating method thereof.

Another aspect of the present inventive concept is to provide a memory device efficiently using repair resources during a repair operation, a memory system including the same, and an operating method thereof.

According to an aspect of the present inventive concept, a memory device includes at least one swap circuit swapping a plurality of decoded row addresses with a repair address using repair data, at least one register storing the repair data, a wordline activation signal driver receiving the repair address and outputting a wordline activation signal, and a sub-wordline driver activating corresponding sub-wordlines in response to the wordline activation signal.

According to another aspect of the present inventive concept, a memory device includes a plurality of sub-blocks implemented in a core-on-peripheral (COP) structure and a row decoder controlling the plurality of sub-blocks, wherein each of the plurality of sub-blocks includes a peripheral circuit in a position above a substrate, and the peripheral circuit includes a swap circuit converting a plurality of decoded row addresses into one repair address using repair data.

According to another aspect of the present inventive concept, an operating method of a memory device includes receiving an address from an external device, determining whether the received address is a failure address, determining whether to swap the received address with a repair address using a swap circuit when the received address is the failure address, and swapping the received address with the repair address and then performing access using the repair address, wherein the swap circuit exchanges a plurality of addresses with the repair address using repair data.

According to another aspect of the present inventive concept, a memory system includes a plurality of memory devices and a controller controlling the plurality of memory devices, wherein each of the plurality of memory devices includes a swap circuit swapping a plurality of row addresses with one repair address using repair data and a register storing the repair data.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Principles and embodiments of the present invention relate to a memory repair method involving an address-swapping function to implement a redundancy cell array.

In order to provide full memory capacity of DRAM, a repair method of replacing defective cells with spare cells or redundancy cells provided separately from normal cells is employed as a method of repairing defective cells. For example, a repair method is employed in which a row including a defective cell is replaced with a spare row or redundancy row (referred to as row repair) or a column including a defective cell is replaced with a spare column or redundancy column (referred to as column repair).

A memory device, a memory system having the same, and an operating method thereof according to an embodiment of the present inventive concept, may be implemented to provide a repair function for a row decoder and an address-swapping function for each sub-wordline driver unit. The memory device can be configured as a core on a peripheral (COP) and may include a circuit for swapping addresses for each sub-block within the core, as well as a register that stores swap data. The memory device, the memory system, and the operating method may conduct multiple repair operations for each sub-block using a piece of repair data. For instance, if different numbers of failures occur in each sub-block, repair operations may be conducted as frequently as the maximum number of sub-blocks (e.g., one for each sub-block) in one sub-wordline driver of a row decoder. Therefore, the memory device, the memory system, and the operating method according to the embodiments may efficiently utilize repair resources.

Hereinafter, example embodiments of the present inventive concept will be described with reference to the accompanying drawings.

Figure 1:
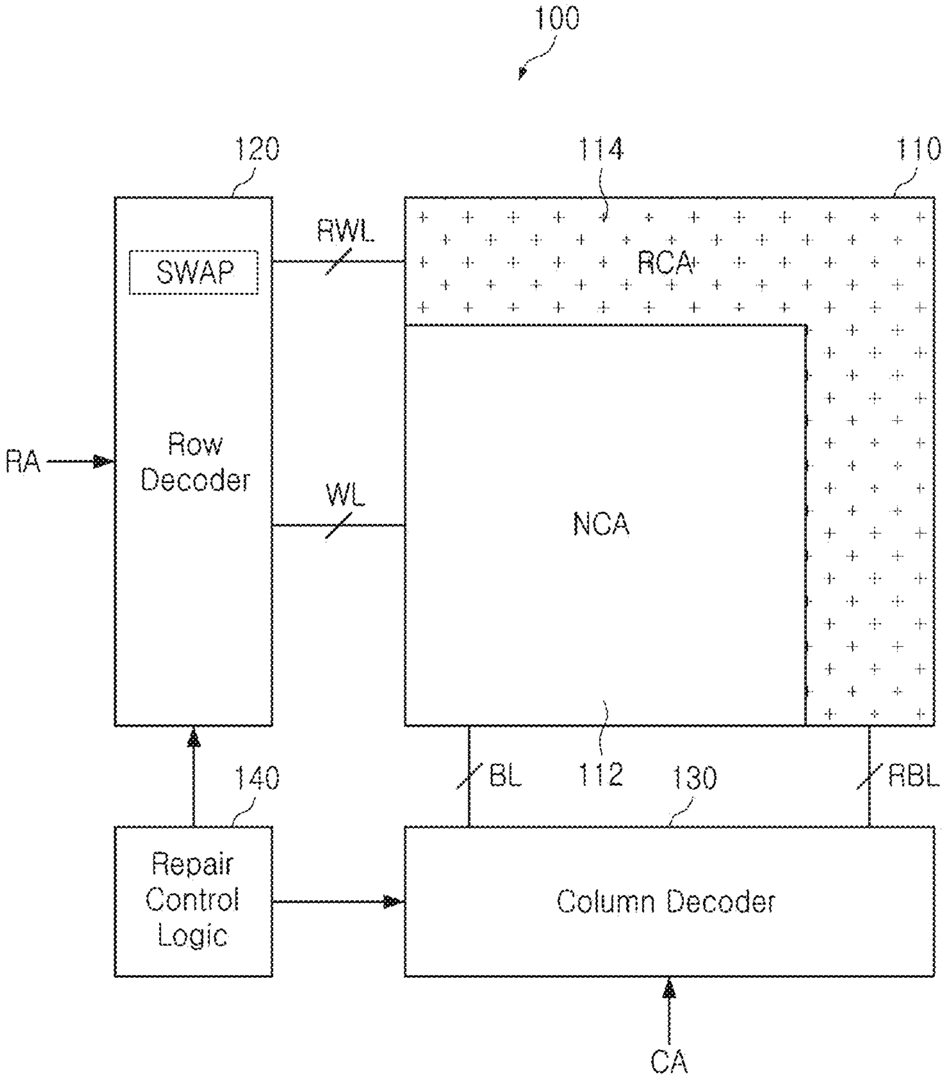
FIG. 1 is a diagram illustrating a memory device according to an embodiment of the present inventive concept.

FIG. 1 is a diagram illustrating a memory device 100 according to an embodiment of the present inventive concept. Referring to FIG. 1, the memory device 100 may include a memory cell array 110, a row decoder 120, a column decoder 130, and repair control logic 140.

In various embodiments, the memory cell array 110 may include a normal cell array NCA 112 in which a plurality of memory cells are arranged and a redundancy cell array RCA 114 in which a plurality of redundancy memory cells are arranged. In an embodiment, the normal cell array 112 may include a plurality of memory cells respectively arranged at intersections of a plurality of wordlines WL and a plurality of bitlines BL. Each of the plurality of memory cells may include a volatile memory cell or a nonvolatile memory cell.

In an embodiment, the redundancy cell array 114 may be adjacent to the normal cell array 112 in an extending direction of the wordlines WL. For example, the redundancy cell array 114 may include a plurality of redundancy memory cells respectively arranged at intersections of a plurality of redundancy bitlines RBL and a plurality of wordlines WLs, where the wordlines WL extend from the normal cell array 112. In an embodiment, the redundancy cell array 114 may be adjacent to the normal cell array 112 in the extending direction of the bitlines BLs. For example, the redundancy cell array 114 may include a plurality of redundancy memory cells respectively arranged at intersections of the plurality of redundancy wordlines RWL and the plurality of bitlines BL, where the bitlines BL extend from the normal cell array 112.

A defect may occur in at least one of the memory cells arranged in the normal cell array 112, where a defective cell may be a single bit, a weak cell, or a defect cell. The defective cell occurring in the normal cell array 112 may be replaced by a redundancy memory cell included in the redundancy cell array 114. This replacement operation is referred to as a "repair operation." Subsequent to the repair operation, read data may be stored in the redundancy memory cell or read from the redundancy memory cell.

In various embodiments, in response to a row address (RA), a row decoder 120 may select at least one wordline from among the plurality of wordlines WL and activate the selected wordline. In addition, in response to a row address matching signal, the row decoder 120 may select at least one redundancy wordline from among the plurality of redundancy wordlines RWL and activate the selected redundancy wordline. For example, the row decoder 120 may activate a corresponding redundancy wordline RWL in response to the row address matching signal.

In various embodiments, the row decoder 120 may include at least one swap circuit SWAP configured for swapping a plurality of row addresses with a repair address, where there can be one or more repair addresses utilized from a plurality of repair addresses. At least one swap circuit SWAP may convert repair data of physically different addresses into the logically same repair address for each sub-block. Also, at least one swap circuit SWAP may exchange decoded row addresses with repair data. The repair data may be set according to power-ON of the memory device 100 or provided by an external device. At least one swap circuit may be in each of the plurality of memory blocks, where at least one swap circuit SWAP may be included in each of a plurality of sub-blocks.

In various embodiments, in response to a column address CA, the column decoder 130 may select at least one bitline from among the plurality of bitlines BL and activate the selected bitline. In addition, in response to a column address matching signal, the column decoder 130 may select at least one redundancy bitline from among the plurality of redundancy bitlines RBL and activate the selected redundancy bitline. For example, in response to the column address matching signal, the column decoder 130 may deactivate the column address CA and activate the redundancy column bitline.

In various embodiments, the repair control logic 140 may be implemented to perform a repair operation on a defective cell among a plurality of memory cells. For example, when an input row address RA corresponds to a defective cell, the repair control logic 140 may generate a row address matching signal. Also, when the input column address CA corresponds to a defective cell, the repair control logic 140 may generate a column address matching signal. Furthermore, the repair control logic 140 may vary the range of a repair region according to the type of failure. Here, the repair region is a region corresponding to one redundancy address. For example, the repair control logic 140 may vary the type or number of address bits corresponding to the defective cell. The repair control logic 140 may store repair mapping data on the types of address bits or the number of address bits in a nonvolatile memory (e.g., a fuse).

Figure 2:
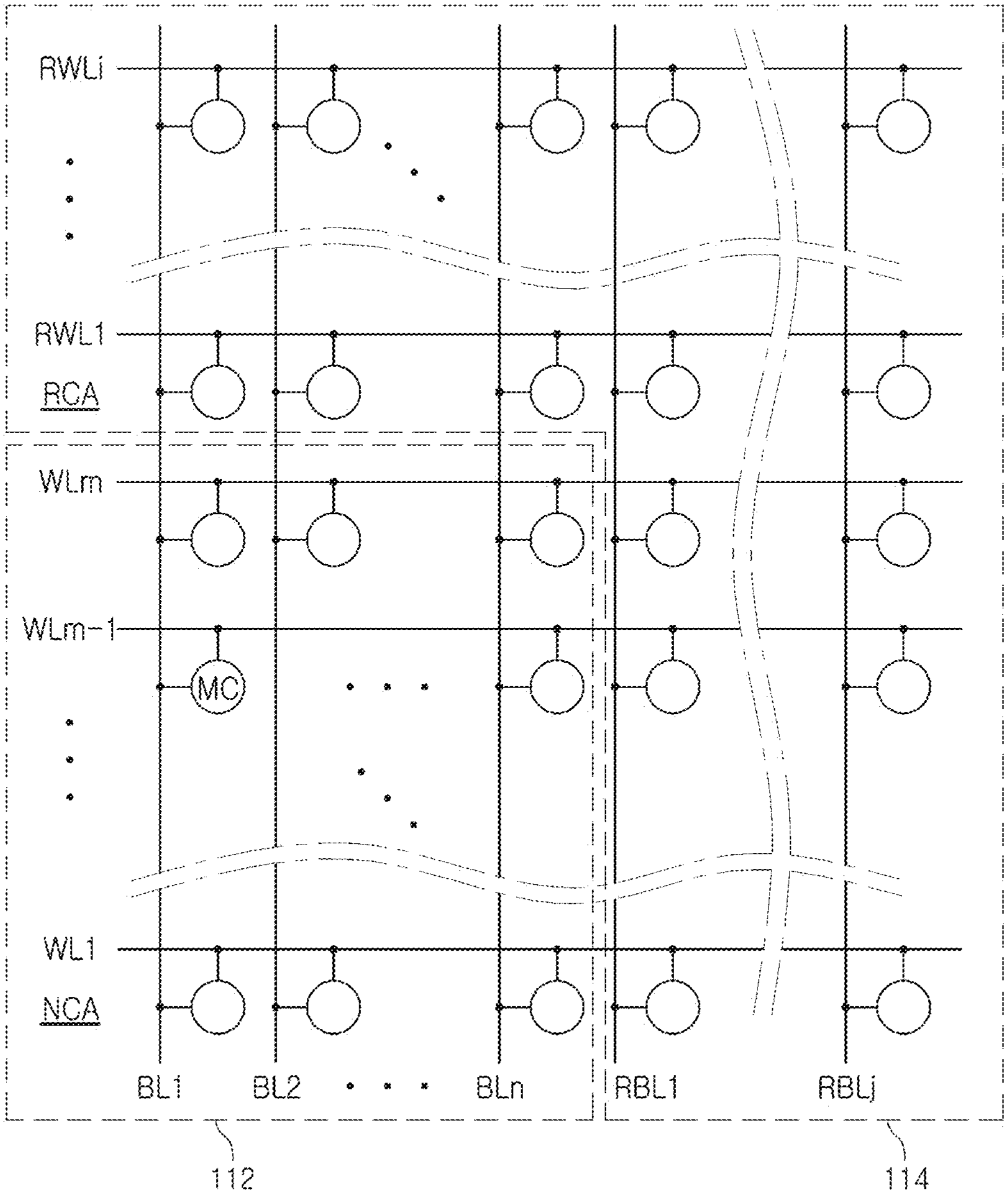
FIG. 2 is a diagram illustrating a memory cell array according to an embodiment of the present inventive concept.

FIG. 2 is a diagram illustrating a memory cell array according to an embodiment of the present inventive concept. Referring to FIG. 2, the memory cell array may include a normal cell array NCA and a redundancy cell array RCA. The normal cell array NCA 112 may include a plurality of memory cells arranged at intersections between wordlines WL1 to WLm (where m is a natural number greater than or equal to 2) and bitlines BL1 to BLn (where n is a natural number greater than or equal to 2). The redundancy cell array RCA 114 may include a plurality of redundancy memory cells arranged at intersections between redundancy wordlines RWL1 to RWLi (where i is a natural number greater than or equal to 2) and redundancy bitlines RBL1 to RBLj (where j is a natural number greater than or equal to 2). The memory cell array may include a plurality of memory cells, where the memory cells can be provided at intersections of wordlines and bitlines. Here, each of the memory cells MC may include a selection transistor and a storage capacitor (e.g., 1T1C cell). Each of the plurality of memory cells may include a vertical channel transistor (VCT) as the selection transistor. The selection transistor may be connected between the storage capacitor and a corresponding bitline, and operate in response to a voltage of a corresponding wordline. The storage capacitor may be connected between the selection transistor and a first node and may store data according to an operation of the selection transistor and a level of the bitline. In an embodiment, the selection transistor may be implemented as a vertical channel transistor VCT. Each of a plurality of memory cells can include a vertical channel transistor (VCT) oriented in a direction perpendicular to the substrate.

In various embodiments, the redundancy wordlines RWL1 to RWLi illustrated in FIG. 2 are arranged above the wordlines WL1 to WLm. However, the positions of the redundancy wordlines RWL1 to RWLi are not limited thereto. The redundancy wordlines RWL1 to RWLi may be arranged below the wordlines WL1 to WLm, or may be arranged as a group inserted between the wordlines WL1 to WLm, or may be arranged as a plurality of groups between the wordlines WL1 to WLm.

In various embodiments, the memory device may include a substrate including a cell region and a peripheral circuit region disposed on at least one side of the cell region, a plurality of cell transistors arranged in the cell region of the substrate, a peripheral circuit disposed in the peripheral circuit region of the substrate, an etch stop layer disposed in the cell region and the peripheral circuit region of the substrate, and including a first portion disposed in the cell region and a second portion disposed in the peripheral circuit region, a capacitor structure disposed in the cell region of the substrate and including a plurality of lower electrodes connected to the plurality of cell transistors through the first portion of the etch stop layer and arranged at a first pitch in a first direction, parallel to an upper surface of the substrate. The second portion of the etch stop layer may include a plurality of recesses arranged at a second pitch identical to the first pitch in the first direction.

Meanwhile, the redundancy bitlines RBL1 to RBLj illustrated in FIG. 2 are arranged on the right of the bitlines BL1 to BLn. However, the positions of the redundancy bitlines RBL1 to RBLj are not limited thereto. The redundancy bitlines RBL1 to RBLj may be arranged on the left of the bitlines BL1 to BLn, or may be arranged as a group inserted between the bitlines BL1 to BLn, or may be arranged as a plurality of groups between the bitlines BL1 to BLn.

Figure 4:
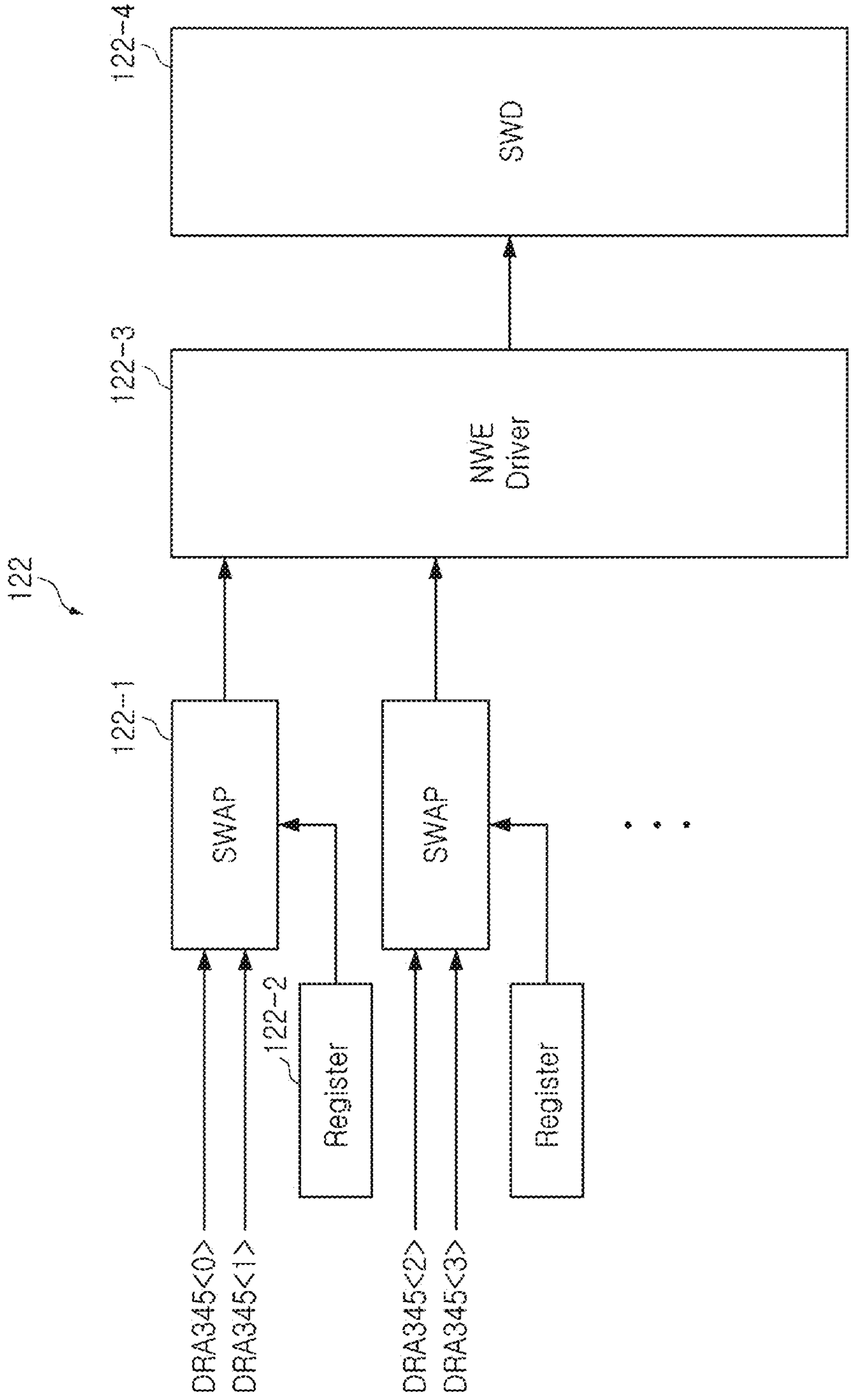
FIG. 4 is a diagram illustrating a wordline driver according to an embodiment of the present inventive concept.

In various embodiments, a sub-wordline control signal generator generating a sub-wordline control signal PXI is provided in the row decoder region. A normal wordline driver NWD is disposed adjacent to the sub-wordline control signal generator. In addition, a sub-wordline control driver (a PXI driver) amplifying the sub-wordline control signal PXI generated by the sub-wordline control signal generator, and supplying the amplified sub-wordline control signal to the sub-wordline driver SWD, as shown in FIG. 4, may be disposed in a junction region of the memory core region. The sub-wordline control drivers can use a high voltage as a power supply voltage and output signals can be arranged in a high voltage. The sub-wordline driver SWD drives a sub-wordline in response to a main wordline signal NWE generated by the normal wordline driver NWD and the output signals PXI from the sub-wordline control driver. Here, since the output signals PXI from the sub-wordline control driver and the sub-wordline control signal PXI have the same voltage level and the output signals PXID from the sub-wordline control driver are signals amplified from the sub-wordline control signal PXI, the signal will be collectively referred to as a sub-wordline control signal PXI.

Figure 3:
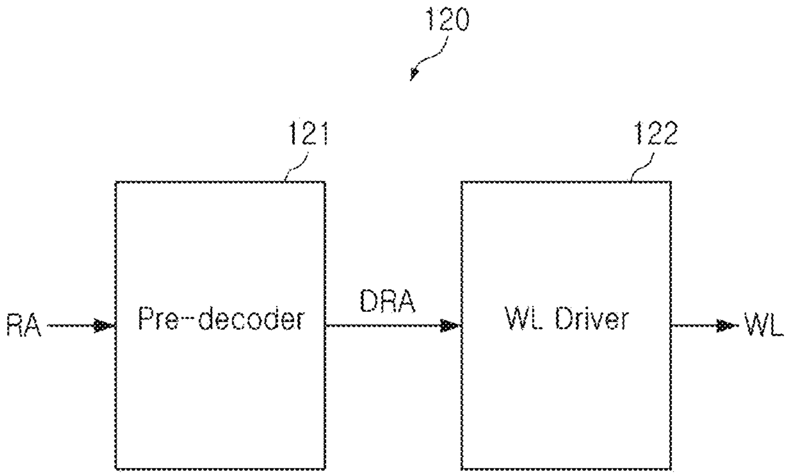
FIG. 3 is a diagram illustrating a row decoder according to an embodiment of the present inventive concept.

FIG. 3 is a diagram illustrating a row decoder 120, according to an embodiment of the present inventive concept. Referring to FIG. 3, the row decoder 120 may include a pre-decoder 121 and a wordline driver 122. The plurality of wordlines WL may include a plurality of sub-wordlines. A plurality of sub-wordlines may be grouped into a plurality of sub-wordline groups. A sub-wordline group may be connected to one main wordline.

In various embodiments, the pre-decoder 121 may be configured to decode an input row address RA and generate a decoded row address DRA, where the decoded row address DRA can be provided to a wordline driver 122. A pre-decoder 121 may be configured to receive a row address and decode the received row address to generate the decoded row address DRA. The decoded row address DRA may include a first decoded row address and a second decoded row address of predetermined bits. For a plurality of decoded row addresses, the number of the plurality of decoded row addresses can be 2. In an embodiment, the first decoded row address may have a length of 2 bits; however, it should be understood that the length of the first decoded row address is not limited thereto.

In various embodiments, the wordline driver 122 may receive the decoded row address DRA and activate corresponding wordlines WL. The wordline driver 122 may include a sub-wordline driver and a normal wordline driver. The sub-wordline driver may be configured to generate a sub-wordline activation signal controlling activation or deactivation of the selected sub-wordline with the sub-wordline selected in response to the first decoded row address. A normal wordline driver may be configured to decode a second decoded row address and generate a wordline activation signal to activate a selected normal wordline.

In various embodiments, the wordline driver 122 may be configured to activate a selected sub-wordline in response to a sub-wordline activation signal and a main wordline activation signal. One of a plurality of sub-blocks may be configured to activate the sub-wordlines corresponding to the repair address according to the first decoded row address. Another of the plurality of sub-blocks may activate the sub-wordlines for activating the repair address according to the second decoded row address. Here, wordlines corresponding to the sub-wordlines may share the wordline activation signal in units of 4 or 8.

FIG. 4 is a diagram illustrating the wordline driver 122, according to an embodiment of the present inventive concept. Referring to FIG. 4, the wordline driver 122 may include at least one swap circuit (SWAP) 122-1, at least one register 122-2, a normal wordline driver (NWE driver) 122-3, and a sub-wordline driver (SWD) 122-4.

In various embodiments, the swap circuit 122-1 may be configured to convert repair data in physically different addresses to the logically same address for each sub-wordline driver block. For example, the swap circuit 122-1 may convert first decoded row address, DRA345<0>, and second decoded row address, DRA345<1>, to the same row address based on the repair data, where the swap circuit 122-1 may exchange data received as an input of the NWE driver with other input data.

In various embodiments, the register 122-2 may be implemented to store the repair data (or exchange data). In an embodiment, the repair data may be set in a register set operation of the memory device 100. In another embodiment, the repair data may be transmitted as needed from an external device (e.g., to a controller). A peripheral circuit may include a register configured for storing the repair data.

In various embodiments, a general memory device maintains a repair unit in a row decoder of NWE (wordline activation) unit (or 4PXI unit) as it is, and changes an address in which a failure occurs to a repair address for each subblock of an array unit.

In various embodiments, the memory device 100, according to an embodiment of the present inventive concept, may use repair resources more efficiently by performing repairs in units of sub-wordline drivers with one repair resource. The memory device 100 of the present inventive concept may facilitate redundancy margin control by using a repair unit of a row decoder, where there is no change in core control, such as sensing operation. Since the memory device 100 of the present inventive concept may be repaired for each sub-block, the memory device 100 has an effect of having as many repair resources as the number of sub-blocks.

In various embodiments, the memory device 100 of the present inventive concept may receive segmentation data from the column decoder 130 and operate repair resources according to different addresses for each position. In preparation for the concept of column decoder repair, the memory device 100 of the present inventive concept may include the swap circuit 122-1 instead of a comparison circuit. In an embodiment, the swap circuit 122-1 may be disposed as a COP. For example, a circuit (the NWE driver 122-3) in the row decoder 120 may be disposed at the bottom of the cell. Accordingly, the area of the memory device 100 may be expected to be reduced. A plurality of decoded row addresses may be replaced with one failure address by using the swap circuit 121-1 and swapping a DRA coding applied to the NWE driver 122-3. If the row decoder 120 performs a repair operation, it is possible to physically make a plurality of failures logically appear as one failure. This makes it possible to repair a plurality of failures without using repair resources equal to the number of failures.

Figure 5A:
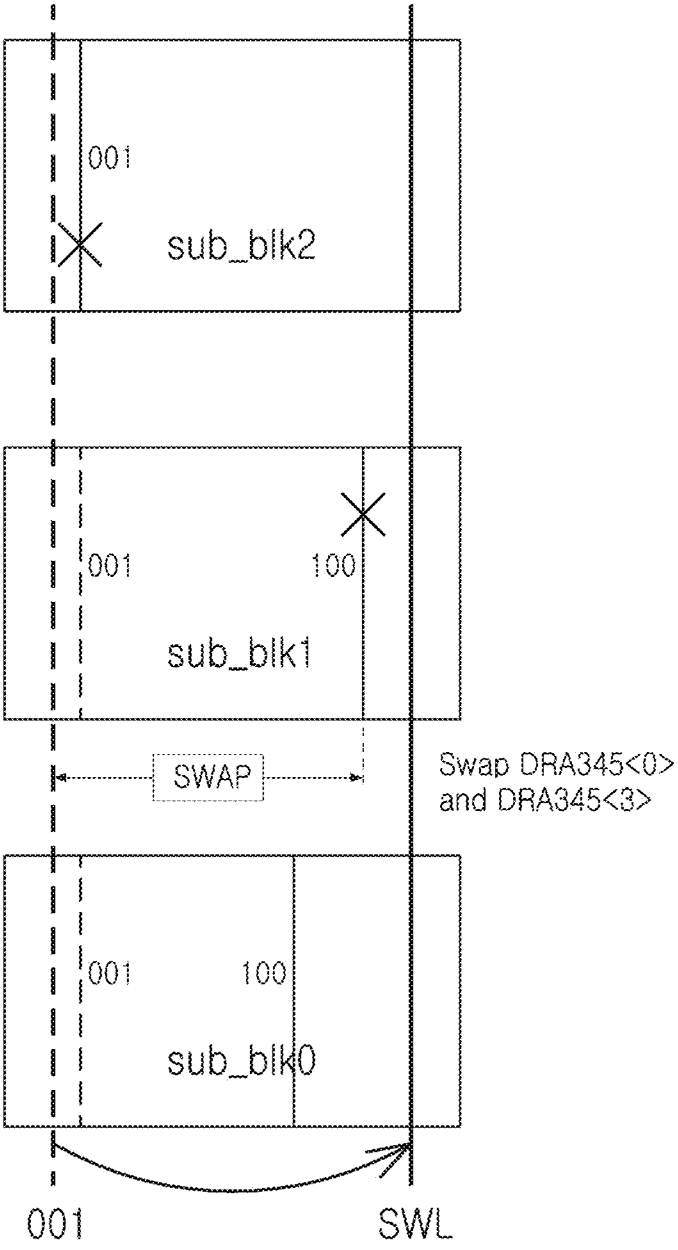
FIG. 5A is a diagram illustrating a repair operation using a swap circuit SWAP according to an embodiment of the present inventive concept.

FIG. 5A is a diagram illustrating a repair operation using a swap circuit SWAP, according to an embodiment of the present inventive concept. As illustrated in FIG. 5A, when a plurality of failures occur in one sub-block, the plurality of failures may be repaired with one resource. For example, it is assumed that a failure occurs at an address 100 in a sub-block (sub_blk1) and a failure occurs at an address 001 in a sub-block (sub_blk2). The address 100 of the sub-block (sub_blk1) and address 001 may be swapped, and the address 001 may be repaired in the row decoder 120.

A general memory device may use two repair resources, but in the memory device 100, according to the present inventive concept, two failures may be repaired with only one repair resource.

Because the memory device 100 of the present inventive concept is based on a method of mixing addresses, it may be determined that it is impossible to repair a plurality of failures in one sub-block by using a combination of all addresses, and a circuit configuration may be arranged by swapping only specific addresses. For example, a failure address may be aligned with DRA345<0> or <1>.

In general, a memory device may include a plurality of blocks in the first direction. Here, each of the plurality of blocks may include a plurality of sub-blocks arranged in a second direction, different from the first direction. Each of the plurality of memory blocks may be implemented as a core on peripheral (COP) structure. Each of a plurality of memory blocks may include a plurality of sub-blocks. A plurality of sub-blocks may be implemented in a core-on-peripheral (COP) structure. In an embodiment, the second direction may be a direction, perpendicular to the first direction.

Figure 5B:
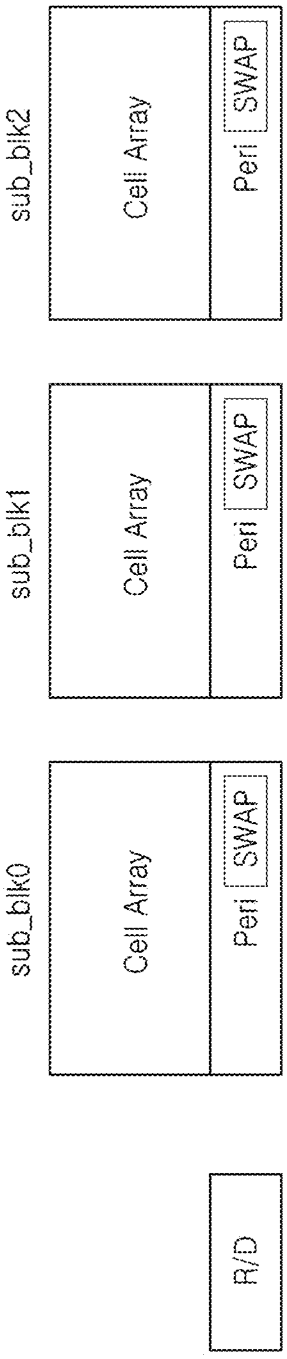
FIG. 5B is a diagram illustrating a memory device having a COP structure according to an embodiment of the present inventive concept.

FIG. 5B is a diagram illustrating a memory device having a COP structure, according to an embodiment of the present inventive concept. Referring to FIG. 5B, a row decoder R/D may control a plurality of sub-blocks, for example, sub-_blk0, sub_blk1, and sub_blk2. Each of the plurality of sub-blocks sub_blk0, sub_blk1, and sub_blk2 may include a peripheral circuit located above the substrate and a cell array located above the peripheral circuit. At least one swap circuit SWAP may be included in each of the plurality of sub-blocks. As illustrated in FIG. 5B, the peripheral circuit may include the swap circuit SWAP described above with reference to FIGS. 1 to 5A.

Figure 6:
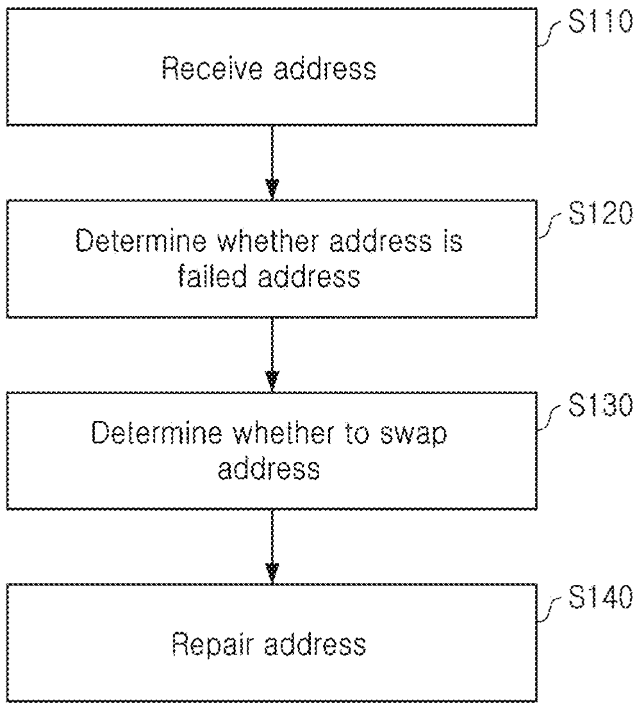
FIG. 6 is a flowchart illustrating a repair operation of a memory device according to an embodiment of the present inventive concept.

FIG. 6 is a flowchart illustrating a repair operation of a memory device, according to an embodiment of the present inventive concept. Referring to FIGS. 1 to 6, the memory device 100 may perform a repair operation as follows.

In various embodiments, the memory device 100 may receive an address from an external source (S110). The memory device 100 may determine whether the received address is a failure address (S120). When the address is a failure address, the memory device 100 may determine to swap the failure address with a repair address (S130). The memory device 100 may subsequently perform a repair operation using the repair address in response to the determination to swap the failure address with a repair address (S140).

In various embodiments, the memory device may include a plurality of banks.

An operating method of a memory device can include receiving an address from an external device, determining whether the received address is a failure address, determining whether to swap the received address with a repair address using a swap circuit when the received address is the failure address, swapping the received address with the repair address; and then performing access using the repair address, wherein the swap circuit exchanges a plurality of addresses with the repair address using repair data. The repair data may be stored according to a request of the external device.

Figure 7:
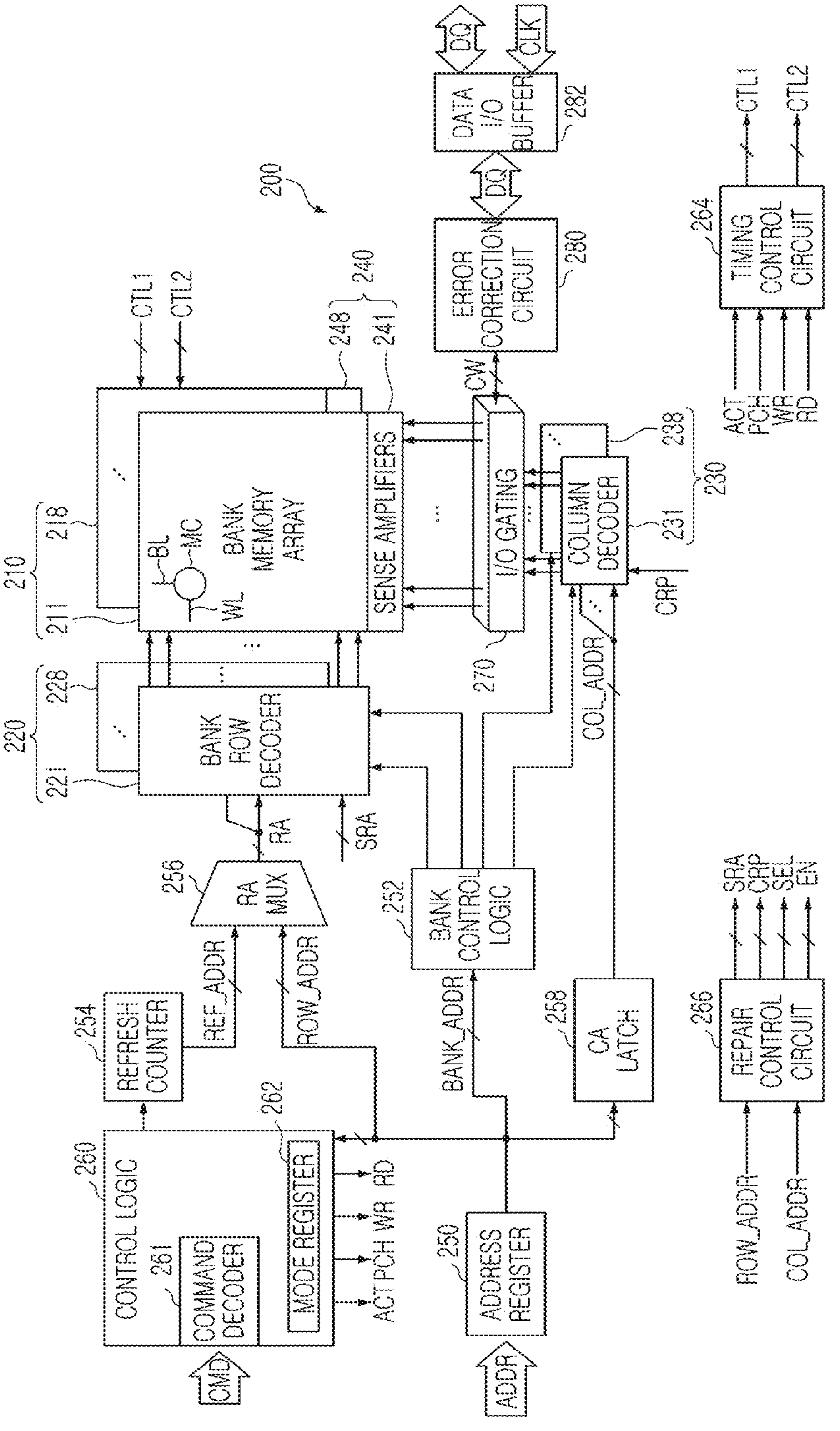
FIG. 7 is a diagram illustrating a memory device according to another embodiment of the present disclosure.

FIG. 7 is a diagram illustrating a memory device, according to another embodiment of the present disclosure. Referring to FIG. 7, a memory device 200 may include a memory cell array 210, a row decoder 220, a column decoder 230, a sense amplifier circuit 240, an address register 250, a bank control logic 252, a refresh counter 254, a row address multiplexer 256, a column address latch 258, a control logic 260, a repair control circuit 266, a timing control circuit 264, an input/output (I/O) gating circuit 270, an error correction circuit 280, and a data I/O buffer 282.

In various embodiments, the memory cell array 210 may include a first bank array 211 to an eighth bank array 218, but it should be understood that the number of bank arrays constituting the memory cell array 210 is not limited thereto.

In various embodiments, the first to eighth bank arrays 211 to 218, first to eighth bank row decoders 221 to 228, first to eighth bank column decoders 231 to 238, and first to eighth bank sense amplifiers 241 to 248 may configure first to eighth banks, respectively. Each of the first to eighth bank arrays 211 to 218 may include a plurality of memory cells MC formed at intersections of wordlines WL and bitlines BL. In an embodiment, each of the first to eighth bank arrays 211 to 218 may include the normal cell array 112 and the redundancy cell array 114 of the memory cell array 110, as illustrated in FIG. 1.

In various embodiments, the row decoder 220 may include first bank row decoder 221 to eighth bank row decoder 228, respectively connected to the first to eighth bank arrays 211 to 218. In an embodiment, each of the first to eighth bank row decoders 221 to 228 may be implemented to perform a repair operation using the address swap function described above with reference to FIGS. 1 to 6. In an embodiment, a bank row decoder activated by the bank control logic 252 among the first to eighth bank row decoders 221 to 228 may decode a row address RA output from the row address multiplexer 256 to activate a wordline corresponding to the row address. For example, the activated bank row decoder may apply a wordline driving voltage to the wordline corresponding to the row address. In addition, the activated bank row decoder may activate a redundancy wordline corresponding to a spare row address (SRA) (or a 'redundancy row address') output from the repair control circuit 266, simultaneously when activating the wordline corresponding to the row address.

In various embodiments, the column decoder 230 may include first bank column decoder 231 to eighth bank column decoder 238, respectively connected to the first to eighth bank arrays 211 to 218. In an embodiment, a bank column decoder activated by the bank control logic 252 among the first to eighth bank column decoders 231 to 238 may activate sense amplification corresponding to a bank address BANK_ADDR and a column address COL_ADDR through the I/O gating circuit 270. The activated bank column decoder may perform a column repair operation in response to a column repair signal CRP output from the repair control circuit 266.

In various embodiments, the sense amplifier circuit 240 may include first bank sense amplifier 241 to eighth bank sense amplifier 248, respectively connected to the first to eighth bank arrays 211 to 218.

In various embodiments, the address register 250 may receive an address ADDR having the bank address BANK_ADDR, a row address ROW_ADDR, and the column address COL_ADDR from an external memory controller, and store the same. The address register 250 may provide the received bank address BANK_ADDR to the bank control logic 252, the received row address ROW_ADDR to the row address multiplexer 256, and the received column address COL_ADDR to the column address latch 258.

In various embodiments, the bank control logic 252 may generate bank control signals in response to the bank address BANK_ADDR. A bank row decoder corresponding to the bank address BANK_ADDR among the first to eighth bank row decoders 221 to 228 may be activated in response to the bank control signals. A bank column decoder corresponding to the bank address BANK_ADDR, among the first to eighth bank column decoders 231 to 238, may be activated in response to the bank control signals.

In various embodiments, the row address multiplexer 256 may receive a row address ROW_ADDR from the address register 250 and receive a refresh row address REF_ADDR from the refresh counter 254. The row address multiplexer 256 may selectively output the row address ROW_ADDR or the refresh row address REF_ADDR, as a row address RA. The row address RA output from the row address multiplexer 256 may be applied to each of the first to eighth bank row decoders 221 to 228.

In various embodiments, the column address latch 258 may receive the column address COL_ADDR from the address register 250 and temporarily store the received column address COL_ADDR. The column address latch 258 may incrementally increase the received column address COL_ADDR in a burst mode. The column address latch 258 may apply the temporarily stored or incrementally increased column address COL_ADDR to each of the first to eighth bank column decoders 231 to 238.

In various embodiments, the control logic circuit 260 may be implemented to control the operation of the semiconductor memory device 200. For example, the control logic circuit 260 may generate control signals to allow the semiconductor memory device 200 to perform a write operation or a read operation. The control logic circuit 260 may include a command decoder 261 configured to decode a command CMD received from the memory controller, and a mode register 262 configured to set an operation mode of the memory device 200. For example, the command decoder 261 may decode a write activation signal/WE, a row address strobe signal/RAS, a column address strobe signal/CAS, a chip select signal/CS, and the like, to generate operation control signals ACT, PCH, WE, and RD corresponding to the command CMD. The control logic circuit 260 may provide the operation control signals ACT, PCH, WE, and RD to the timing control circuit 264. The control signals ACT, PCH, WR, and RD may include an active signal ACT, a precharge signal PCH, a write signal WR, and/or a read signal RD. In response to the operation control signals ACT, PCH, WR, and RD, the timing control circuit 264 may generate first control signals CTL1 for controlling a voltage level of the wordline WL and second control signals CTL2 for controlling a voltage level of the bitline BL, and provide the first control signals CTL1 and the second control signals CTL2 to the memory cell array 210.

Based on the row address ROW_ADDR and the column address COL_ADDR of the address ADDR (or an access address) and fuse data of each of the wordlines, the repair control circuit 266 may generate repair control signals CRP, SEL, EN, and SRA for controlling a repair operation of the first cell region and the second cell region of at least one of the bank arrays. The repair control circuit 266 may provide a spare row address (SRA) (or redundancy row address) to a corresponding bank row decoder 221 to 228, provide a column repair signal (CRP) to a corresponding bank column decoder 231 to 238, and provide a selection signal (SEL) and the activation signal SRA to a block control circuit related to a corresponding spare array block (or a redundancy array block). The repair control circuit 266 may vary a repair unit based on the address ADDR and fuse data. For example, the repair control circuit 266 may vary the type and number of repair address bits based on the address ADDR and the fuse data.

Each of the I/O gating circuits of the I/O gating circuit 270 may include an input data mask logic, read data latches for storing data output from the first to eighth bank arrays 211 to 228, and write drivers for writing data to the first to eighth bank arrays 211 to 218, together with circuits for gating I/O data.

During a write operation, the error correction circuit 280 may generate parity bits based on data bits of data DQ provided to the error correction circuit 280 from the data I/O buffer 282, and provide a codeword CW including the data DQ and the parity bits to the I/O gating circuit 270. The I/O gating circuit 270 may write the codeword CW in a first to eighth bank array 211 to 218. Also, during a read operation, the error correction circuit 280 may receive a codeword CW read from one bank array from the I/O gating circuit 270. The error correction circuit 280 may perform ECC decoding on the data DQ using the parity bits included in the read codeword CW, correct at least one error bit included in the data DQ, and provide corresponding data to the data I/O buffer 282.

In various embodiments, a codeword CW to be read from one bank array from among the first to eighth bank arrays 211 to 218 may be sensed by sense amplification corresponding to the one bank array and stored in read data latches. The codeword CW stored in the read data latches may undergo ECC decoding and may then be provided to the memory controller through the data I/O buffer 282. The write data DQ may undergo ECC encoding in the error correction circuit 280 and then may be written to one bank array among the first to eighth bank arrays 211 to 218 through write drivers.

In various embodiments, during the write operation, the data I/O buffer 282 may provide the data DQ to the error correction circuit 280 based on a clock signal CLK provided from the memory controller, and during the read operation, the data DQ provided from the error correction circuit 280 may be provided to the memory controller.

In various embodiments, a memory system can include a plurality of memory devices; and a controller configured to control the plurality of memory devices, wherein each of the plurality of memory devices includes a swap circuit configured to swap a plurality of row addresses with one repair address using repair data, and a register configured to store the repair data. Each of the plurality of memory devices may be implemented as a COP structure, where each of the plurality of memory devices includes a plurality of sub-blocks having a plurality of memory cells arranged at intersections of wordlines and bitlines, and each of the plurality of memory cells includes a vertical channel transistor (VCT).

In various embodiments, each of the plurality of sub-blocks may include a peripheral circuit disposed on a substrate; and a memory cell array disposed above the peripheral circuit, wherein the peripheral circuit includes the swap circuit and the register. The swap circuit can receive one of a first decoded row address and a second decoded row address and outputs a repair address according to the repair data. The controller can transmit the repair data to the register.

Figure 8:
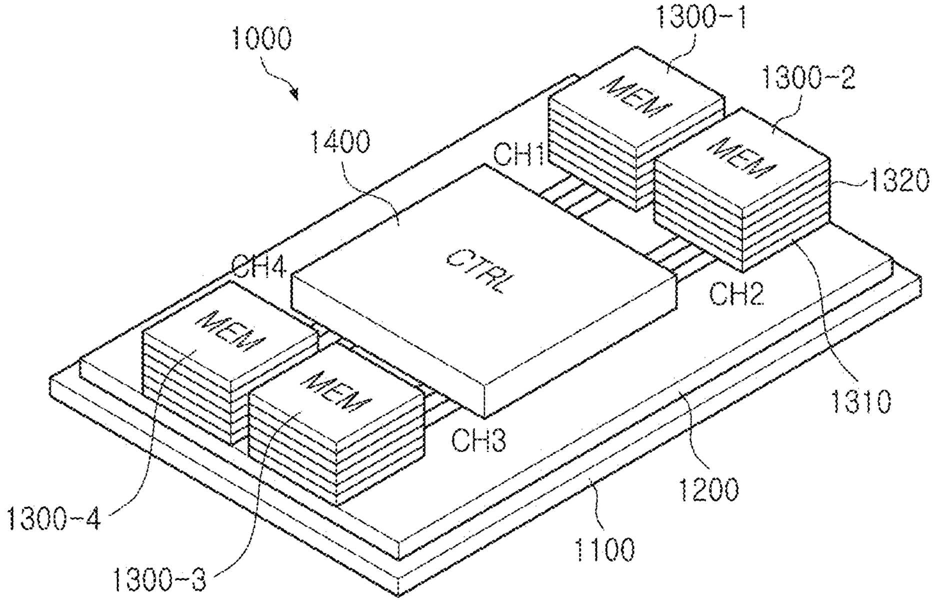
FIG. 8 is a diagram illustrating a memory system according to an embodiment of the inventive concept.

FIG. 8 is a diagram illustrating a memory system 1000, according to an embodiment of the inventive concept. Referring to FIG. 8, the memory system 1000 may include a plurality of memory modules 1300-1, 1300-2, 1300-3, and 1300-4 and a controller (CTRL) 1400. In an embodiment, an interposer 1200 may be provided on a package substrate 1100.

In various embodiments, the memory system 1000 may be configured to be included in a personal computer (PC) or a mobile electronic device. Mobile electronic devices may be implemented as laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PNDs), handheld game consoles, mobile Internet devices (MIDs), wearable computers, IoT (Internet of Things) devices, IoE (Internet of Everything) devices, or drones.

Each of the memory modules 1300-1, 1300-2, 1300-3, and 1300-4 may be configured to be mounted on the package substrate 1100, such as a printed circuit board. In addition, each of the memory modules 1300-1 to 1300-4 may be connected to the controller 1400 through channels CH1 to CH4 and may be configured as a chip-on-chip (CoC).

Also, each of the memory modules 1300-1 to 1300-4 may include a buffer chip 1310 and at least one memory chip (MEM) 1320. Here, the buffer chip 1310 and at least one memory chip 1320 may be connected to each other by a through-silicon via (TSV).

In various embodiments, the buffer chip 1310 may be configured to perform a buffering function for data of the memory chip 1320. Also, the buffer chip 1310 may be implemented to perform a training operation on the memory chip 1320.

In various embodiments, the memory chip (MEM) 1320 may be implemented as a volatile memory device or a nonvolatile memory device. In an embodiment, the volatile memory device may be implemented as random access memory (RAM), dynamic RAM (DRAM), static RAM (SRAM), or low power double data rate (LPDDR) DRAM. In an embodiment, the nonvolatile memory device may be implemented as an electrically erasable programmable read-only memory (EPROM), a NOR flash memory, a NAND flash memory, a magnetoresistive random access memory (MRAM), a spin transfer torque (STT)-MRAM, a ferroelectric memory (FeRAM), a phase change RAM (PRAM), a resistive RAM (RRAM), a nanotube RRAM, a polymer RAM (PoRAM), a nano floating gate memory (NFGM), a holographic memory, a molecular electronics memory device, or an insulation resistance change memory. As described above with reference to FIGS. 1 to 7, the memory chip 1310 may be implemented to swap a plurality of addresses with one repair address.

In an embodiment, each of the memory modules 1300-1, 1300-2, 1300-3, and 1300-4 may be a high bandwidth memory (HBM). Meanwhile, it should be understood that the number of memory modules 1300-1, 1300-2, 1300-3, and 1300-4 illustrated in FIG. 8 is not limited.

The controller (CTRL) 1400 may be configured to control the memory modules 1300-1, 1300-2, 1300-3, and 1300-4 respectively connected to channels. In an embodiment, the controller 1400 may be implemented as a system-on-chip (SoC), an application processor (AP), a mobile AP, a chipset, or a set of chips. The controller 1400 may include a random access memory (RAM), a central processing unit (CPU), a graphics processing unit (GPU), a neural network processing unit (NPU), or a modem. In an embodiment, the controller 1400 may perform functions of a modem and an AP. The controller 1400 may determine the need for a repair operation of the memory chip and transmit repair data necessary for the repair operation to the memory chip.

Also, the controller 1400 may be configured to control the memory chip 1310 to read data stored in the memory chip 1310 or write data to the memory chip 1310. The controller 1400 may control a write operation or a read operation regarding the memory chip 1320 by providing a command and an address to the memory chip 1310 in synchronization with a clock signal. Also, data may be transmitted and received between the controller 1400 and the memory chip 1320 in synchronization with a data transmission clock.

In various embodiments, the controller 1400 may control the memory modules 1300-1, 1300-2, 1300-3, and 1300-4 to provide a data mirroring function, where at least two of the memory modules 1300-1, 1300-2, 1300-3, and 1300-4 may store the same data during a write operation. For example, the controller 1400 may control the memory module 1300-1 connected to a first channel CH1 and the memory module 1300-2 connected to a second channel CH2 to simultaneously write the same data in response to one write command to each memory module 1300-1 and 1300-2. In addition, the controller 1400 may support a mirroring mode providing a data mirroring function and a normal mode providing a normal operation during a write operation. The memory system 1000 may write the same data to a plurality of memory channels CH1 to CH4 in the mirroring mode, and when data in some channels is damaged, data integrity may be maintained by using data in channels that are not damaged.

In the memory device and the operating method thereof according to an embodiment of the present inventive concept, repair improvement in VCT using DRA data swap may be expected.

The memory device, the memory system including the same, and the operating method thereof, according to an embodiment of the present inventive concept, may efficiently use repair resources by including the unit for electrically exchanging a plurality of addresses with each other.

While example embodiments have been illustrated and described above, it will be apparent to those skilled in the art that modifications and variations could be made without departing from the scope of the present inventive concept as defined by the appended claims.

What is claimed is:

1. A memory device comprising:

at least one swap circuit configured to swap a plurality of decoded row addresses with a repair address using a single piece of repair data for multiple sub-blocks within the memory device;

at least one register configured to store the repair data, wherein the single piece of repair data is used for conducting a plurality of repair operations corresponding to a maximum number of sub-blocks having failures;

a wordline activation signal driver configured to receive the repair address and output a wordline activation signal; and a sub-wordline driver configured to activate corresponding sub-wordlines in response to the wordline activation signal, wherein the sub-wordline driver is part of a row decoder that performs the plurality of repair operations for each sub-block using the single piece of repair data.

2. The memory device of claim 1, further comprising a pre-decoder configured to receive a row address and decoding the received row address.

3. The memory device of claim 1, wherein the number of the plurality of decoded row addresses is 2.

4. The memory device of claim 1, wherein a memory cell array including a plurality of memory cells is provided at intersections of wordlines and bitlines, the memory cell array includes a plurality of memory blocks, each of the plurality of memory blocks includes a plurality of sub-blocks, and the at least one swap circuit is included in each of the plurality of sub-blocks.

5. The memory device of claim 4, wherein each of the plurality of memory blocks is implemented as a core on peripheral (COP) structure.

6. The memory device of claim 4, wherein each of the plurality of memory cells includes a vertical channel transistor (VCT).

7. The memory device of claim 4, wherein the row decoder is configured to select one of the wordlines, wherein the row decoder is disposed on the left or right of the plurality of memory blocks.

8. The memory device of claim 7, wherein the at least one swap circuit is in each of the plurality of memory blocks.

9. The memory device of claim 1, wherein the at least one swap circuit converts the repair data of physically different addresses into a logically same repair address for each sub-block.

10. The memory device of claim 1, wherein the at least one swap circuit exchanges the decoded row addresses with the repair data.

11. A memory device comprising:

a plurality of sub-blocks implemented in a core-on-peripheral (COP) structure; and a row decoder configured to control the plurality of sub-blocks, wherein each of the plurality of sub-blocks includes a peripheral circuit in a position above a substrate, wherein the peripheral circuit includes a swap circuit that uses a single piece of repair data to convert a plurality of decoded row addresses into one repair address for multiple sub-block repairs;

a single register configured to store the single piece of repair data, wherein the single piece of repair data is used for conducting a plurality of repair operations corresponding to a maximum number of sub-blocks having failures;

a wordline activation signal driver configured to receive the one repair address and output a wordline activation signal; and a sub-wordline driver, included in the row decoder, configured to activate corresponding sub-wordlines in response to the wordline activation signal, wherein the sub-wordline driver performs the plurality of repair operations for each sub-block using the single piece of repair data.

12. The memory device of claim 11, wherein the peripheral circuit further includes a register storing the repair data.

13. The memory device of claim 11, wherein the plurality of decoded row addresses includes a first decoded row address and a second decoded row address.

14. The memory device of claim 13, wherein one of the plurality of sub-blocks activates sub-wordlines corresponding to the repair address according to the first decoded row address, and the other of the plurality of sub-blocks activates the sub-wordlines for activating the repair address according to the second decoded row address.

15. The memory device of claim 11, wherein each of the plurality of sub-blocks includes a plurality of memory cells, and each of the plurality of memory cells includes a vertical channel transistor (VCT) oriented in a direction perpendicular to the substrate.

16. An operating method of a memory device, the operating method comprising:

receiving an address from an external device;

determining whether the received address is a failure address;

determining whether to swap the received address with a repair address using a swap circuit when the received address is the failure address;

swapping the received address with the repair address using a single piece of repair data applicable to multiple sub-blocks within the memory device; and performing access using the repair address, wherein the swap circuit uses the single piece of repair data to conduct multiple repair operations for each sub-block.

17. The operating method of claim 16 further comprising decoding the received address.

18. The operating method of claim 16, wherein the swap circuit is disposed in each of the sub-blocks.

19. The operating method of claim 18, wherein each of the sub-blocks is implemented as a core-on-peripheral (COP) structure.

20. The operating method of claim 16, further comprising storing the repair data according to a request of the external device.

* * * * *